United States Patent
Bohlinger

(10) Patent No.: US 7,034,651 B2
(45) Date of Patent: Apr. 25, 2006

(54) MAGNETIC FIELD SENSING DEVICE

(75) Inventor: Michael J. Bohlinger, Minnetonka, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/353,620

(22) Filed: Jan. 29, 2003

(65) Prior Publication Data

US 2003/0141957 A1   Jul. 31, 2003

Related U.S. Application Data

(63) Continuation of application No. 09/085,858, filed on May 27, 1998, now Pat. No. 6,529,114.

(51) Int. Cl.
*H01C 10/12* (2006.01)
(52) U.S. Cl. .............. 338/100; 338/32 R; 324/247
(58) Field of Classification Search .......... 338/32 R; 324/247
See application file for complete search history.

(56) References Cited

U.S. PATENT DOCUMENTS

| | | | |
|---|---|---|---|
| 3,949,345 A * | 4/1976 | Makino et al. ........... 338/32 R |
| 4,441,072 A * | 4/1984 | Rahman .................. 323/368 |
| 4,533,872 A * | 8/1985 | Boord et al. ............. 324/252 |
| 4,847,584 A | 7/1989 | Pant |
| 4,939,459 A * | 7/1990 | Akachi et al. ............ 324/247 |
| 5,521,501 A | 7/1990 | Dettmann et al. |
| 5,247,278 A * | 9/1993 | Pant et al. ............... 338/32 R |
| 5,452,163 A * | 9/1995 | Coffey et al. ............ 360/324 |
| 5,689,185 A | 5/1996 | Widdershoven et al. |
| 5,561,368 A * | 10/1996 | Dovek et al. ............. 324/252 |
| 5,583,436 A | 12/1996 | Van De Walle et al. |
| 5,585,775 A * | 12/1996 | Ishishita .................. 338/32 R |
| 5,621,320 A * | 4/1997 | Yokotani et al. .......... 324/252 |
| 5,945,825 A * | 8/1999 | Clemens ................... 324/252 |
| 6,011,390 A * | 1/2000 | Loreit et al. ........... 324/207.21 |
| 6,069,476 A * | 5/2000 | Vieux-Rochaz et al. .... 324/252 |

FOREIGN PATENT DOCUMENTS

| | | | |
|---|---|---|---|
| GB | 2016788 | * | 9/1979 |
| JP | 2-186285 | | 7/1990 |

* cited by examiner

*Primary Examiner*—Kyung Lee
(74) *Attorney, Agent, or Firm*—McDonnell Boehnen Hulbert & Berghoff LLP

(57) ABSTRACT

Two sensor units are formed from magnetoresistive material. Elements of the first sensor unit have a total anisotropy field in a first direction. Elements of the second sensor unit have a total anisotropy field in a second direction. An integral coil sets a direction of magnetization in the elements of the first and second sensor units. An output of the first sensor unit is representative of magnetic field components perpendicular to the first direction and an output of the second sensor is representative of magnetic field components perpendicular to the second direction.

9 Claims, 2 Drawing Sheets

MAGNETIC FIELD SENSING DEVICE

CROSS REFERENCE TO RELATED APPLICATIONS

This application is a continuation of U.S. patent application Ser. No. 09/085,858, filed May 27, 1998 now U.S. Pat. No. 6,529,114.

U.S. GOVERNMENT RIGHTS (IF ANY)

Not applicable.

BACKGROUND OF THE INVENTION

1. Field of the invention

The present invention relates generally to magnetic field sensing devices and specifically to magnetic field sensing devices capable of sensing magnetic fields along two mutually perpendicular axes. Such two axis magnetic field sensors are required in many applications. Electronic compasses, magnetic field probes, and virtual reality are a few examples of applications where two axis magnetic field sensors are useful.

2. Description of the Prior Art

In the past, two axis magnetic field sensors were typically constructed using two single axis magnetic sensors. For example, U.S. Pat. No. 5,247,278 describes a single axis magnetic field sensor including an integral current strap for setting a direction of magnetization. Two of the sensing devices described in U.S. Pat. No. 5,247,278 can be used to form a two-axis magnetic field sensing device. For simplicity, two-axis magnetic field sensing devices will be referred to herein as an x-axis sensor and a y-axis sensor, meaning that the two axes are perpendicular. In the past, the two single axis sensors could be housed in a single package enclosure and oriented so that their sensitive directions were perpendicular to each other. Alternatively, two single-axis individually-packaged die could be mounted on a circuit board with the sensitive axis of each die perpendicular to the other die. There are disadvantages to the use of two single axis die. One disadvantage of this approach is that it requires extra assembly effort either at the package level or at the board level. In addition, it is difficult to locate the two single-axis die so that they are orthogonal to each other. The best control on the orthogonality of the two single-axis parts in high volume manufacture may be on the order of ±1°, which induces the same level error on compass heading.

A magnetoresistive sensor capable of measuring a low magnetic field requires that the magnetic moment be initially aligned in one direction, which usually is perpendicular to the sensitive direction of the sensor. With a uniform external magnetic field to initialize the alignment of magnetic moment, it is almost impossible to have an x-axis and a y-axis sensor on a single chip. In addition, generally a magnetic film used for magnetoresistive sensors will have its own crystal easy axis which is determined by a magnetic field applied during the deposition of the magnetic film. Single axis sensors typically utilize this easy axis and initially align the magnetic moment along it. Single axis magnetoresistive sensors usually have the crystal anisotropic field and the shape anisotropic field in the same direction to guard against magnetic and thermal disturbances and to maintain a stable and low noise sensor output. The stability of a magnetoresistive sensor is determined at least to some extent by how good it maintains a single magnetic domain state after the magnetic field for aligning or setting the magnetization is removed.

An integrated two-axis magnetoresistive sensor must have a sensitive direction in an x-axis and a sensitive direction along a y-axis. This means that at least one of the sensor's directions cannot be aligned with the crystal easy axis direction. Therefore, consideration must be given to how to deal with the crystal easy axis when attempting to construct a two-axis sensor on a single die, and how to initially align the magnetic moment in both an x direction and a y direction.

The advantage of a two-axis sensor on one die is that the orthogonality of the two sensors is controlled by the photolithography method, which has accuracy in the range of about 0.01°.

Thus a need exists for an integrated two-axis magnetoresistive sensor.

SUMMARY OF THE INVENTION

The present invention solves these and other needs by providing a two-axis integrated device for measuring magnetic fields including two sensor units formed from magnetoresistive material having a crystal anisotropy field direction. Elements of the first sensor unit have a total anisotropy field in a first direction. Elements of the second sensor unit have a total anisotropy field in a second direction which is perpendicular to the first direction. Means are provided for setting a direction of magnetization in the elements of the first and second sensor units. An output of the first sensor unit is representative of magnetic field components perpendicular to the first direction and an output of the second sensor is representative of magnetic field components perpendicular to the second direction.

DETAILED DESCRIPTION

Figure 1:
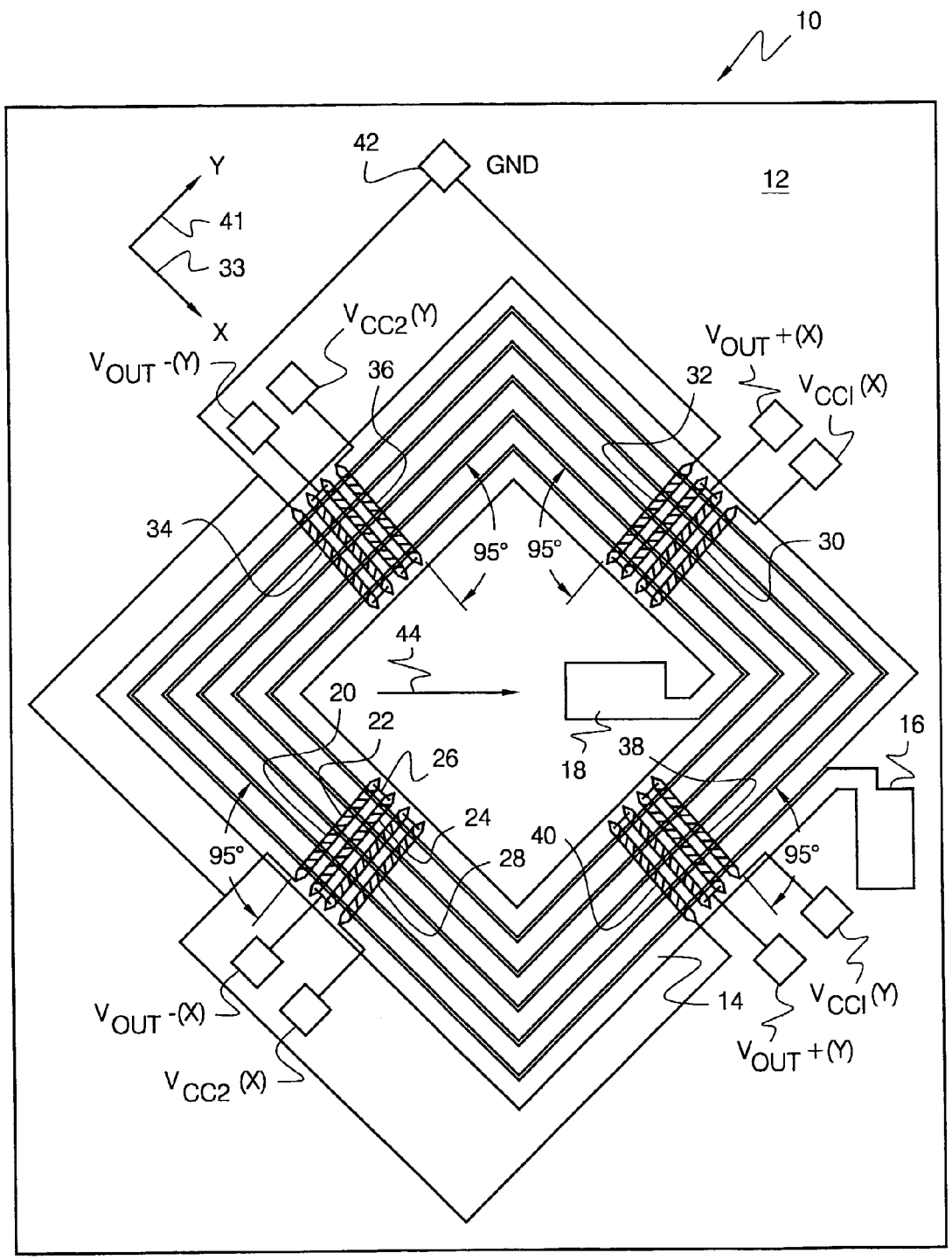
FIG. 1 shows a top plan view of a simplified integrated circuit layout according to the teachings of the present invention.

A device for sensing magnetic field components along two axes is shown in the drawings and generally designated 10. FIG. 1 shows an integrated circuit layout for a magnetic field sensor in accordance with the present invention. An integrated circuit die 12 has formed thereon a conductor or strap 14 which extends from set or set reset pad 16 in a clockwise four sided spiral form and terminates in pad 18. Magnetoresistive elements are formed of elongated strips of magnetoresistive material. FIG. 1 shows for example an element 20 consisting of magnetoresistive strips 22 and 24 and interconnect 26. Only two magnetoresistive strips per element are shown for simplicity, but it is understood that an actual element could include many more strips. Elements 20, 28, 30, and 32 are shown connected in a first Wheatstone bridge arrangement with a power supply connection at Vcc1(X) and Vcc2(X) and an output voltage connection between Vout+(X) and Vout−(X). The direction of sensitivity of the first Wheatstone bridge is shown by arrow 33 and this bridge acts as the x-axis sensor.

Elements 34, 36, 38 and 40 are shown connected as a second Wheatstone Bridge arrangement with a power supply connection at Vcc1(Y) and Vcc2(Y) and an output voltage connection between Vout+(Y) and Vout−(Y). In FIG. 1, separate power supply connections are shown, however they are connected to one common power supply. The direction of sensitivity of the second Wheatstone bridge is shown by arrow 41 and this bridge acts as the Y-axis sensor. Conductive paths as shown in FIG. 1 connect one end of each of elements 20 and 32 of the first Wheatstone bridge and one end of elements 34 and 40 of the second Wheatstone bridge to ground pad 42. Now that the basic construction of magnetic field sensing device 10 has been disclosed, the operation of device 10 according to the teachings of the present invention can be set forth and appreciated.

In the two-axis device of the present invention, the X sensor and the Y sensor must have sensitive directions perpendicular to each other. In the specific embodiment of FIG. 1 the easy axis 44 of the crystal anisotropy field of the magnetoresistive material film is in one direction, that is, it is either 0° or 180° for both the x-axis portion and the y-axis portion of the two sensor units formed in the material. The direction is determined by magnetic field direction during the deposition and annealing of the magnetoresistive material. Other embodiments of the present invention could use films that do not have a crystal anisotropy field.

The construction and operation of the two-axis magnetic field sensing device of the present invention will be explained by reference to the use of elongated strips of a magnetoresistive material such as Permalloy which are interconnected. Various other constructions are possible.

Figure 2:
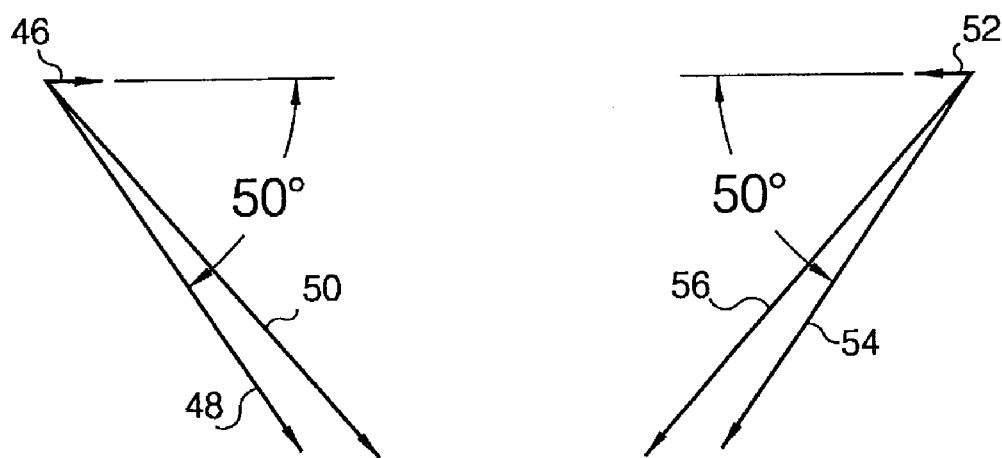
FIG. 2 shows a diagrammatic representation of certain principles according to the teachings of the present invention.

An elongated strip of magnetoresistive material may be considered to have an associated crystal anisotropy field and a shape anisotropy field. The total anisotropy field is the vector sum of the crystal anisotropy field and the shape anisotropy field. FIG. 2 shows, according to the principles of the present invention, the relationship of the anisotropy fields. FIG. 2 shows, for the x-sensor, the easy axis 46 of the crystal anisotropy field, the easy axis 48 of the shape anisotropy field, and the easy axis 50 of the total anisotropy field. The easy axis 48 of the shape anisotropy field is along the length of the elongated strip. By way of example and not by way of a limitation, the crystal anisotropy field may be about 3 Oersted (Oe), and the shape anisotropy field about 25 Oe. In this example, the shape anisotropy field 48 is displaced from the crystal anisotropy field 46 by about 50° in order to cause the total anisotropy field 50 to be displaced from the crystal anisotropy field 46 by about 45°. FIG. 2 also shows for the y-sensor, the easy axis 52 of the crystal anisotropy field, the easy axis 54 of the shape anisotropy field, and the easy axis 56 of the total anisotropy field. The easy axis 54 of the shape anisotropy field is along the length of the elongated strip. Thus for each of the sensors, the total anisotropy field is the vector sum of the crystal anisotropy field and the shape anisotropy field. The sensitive direction of a sensor will be in a direction perpendicular to the total anisotropy field. In order to arrange two sensors on a single die or chip to be sensitive in two mutually perpendicular directions, the total anisotropy field of the two sensors must be perpendicular to each other. In the preferred embodiment of FIG. 1, device 10 is constructed with the x-axis sensor and the y-axis sensor arranged symmetrically relative to the crystal easy axis 44 of the magnetoresistive material. For the specific embodiment of FIG. 1, the elements of the x-axis sensor, i.e., elements 20, 28, 30 and 32, are rotated counterclockwise from the crystal axis by about 50° and the elements of the y-axis sensor, i.e., elements 34, 36, 38 and 40, are rotated clockwise by about 50°.

Figure 3:
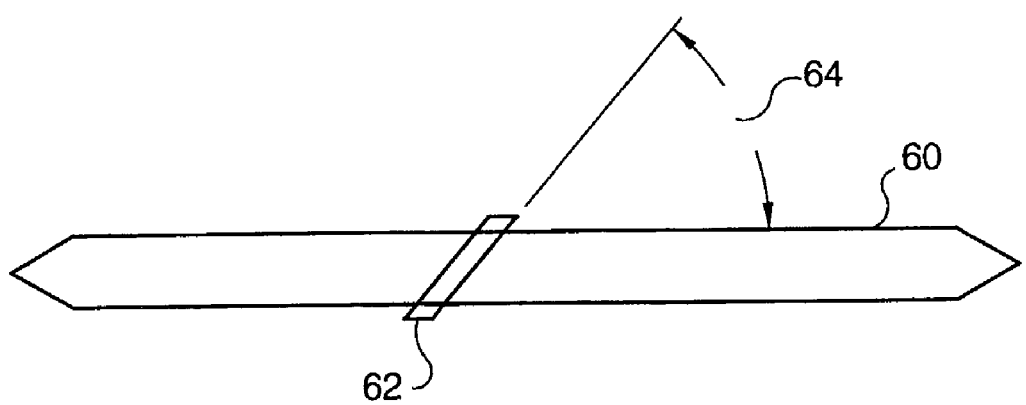
FIG. 3 shows certain additional details of the circuit layout of FIG. 1.

FIG. 3 shows a magnetoresistive strip 60 of the type that could be used to make up the bridge elements shown in FIG. 1. A conductive strip 62 extends across strip 60 and makes an angle 64 of about 50° with strip 60. This angle, of course, will depend on the relationship of the crystal anisotropy field, shape anisotropy field and total anisotropy field for the specific device.

In the traditional design of elements using elongated magnetoresistive strips, the barberpoles have been located at plus or minus 45° to the strips. According to the teachings of the present invention, the width of the barberpoles, the gap between barberpoles, and orientation relative to the magnetoresistive strip need to be optimized to provide an average current flow in the magnetoresistive material that is within about ±45° to the easy axis of total anisotropy fields in both X and Y sensors. In the present invention, within the borders of minimum width and maximum gap, the current flow direction mainly is determined by the barberpole orientations. The barberpole orientations for a specific element are either along the crystal anisotropy field direction or perpendicular to the crystal anisotropy field direction, depending on the position of the element in the Wheatstone bridge.

Now that the construction and operation of device 10 have been described, additional advantages can be set forth and appreciated. In the embodiment of FIG. 1, the first sensor unit and the second sensor unit are located in a first plane, and a coil 14 is located in a second plane. A single coil 14 may be used as a set coil or set/reset coil for both the X sensor and the Y sensor. Coil 14 provides alignment along the total anisotropic field direction for both the X sensor and the Y sensor. By passing a current through coil 14, a magnetic field is provided which is used to generate or set a single domain state in each sensor element before using device 10 to make a measurement or reading. The field provided by the current should be large enough to set the magnetization in a single direction. The current may be used to simply set the magnetization prior to a reading. The current may also be applied in one direction prior to taking a first reading. The current may then be applied in the opposite direction before taking a second reading in what is referred to as a set/reset application. The use of a single coil permits a reduced size for the die and also results in reduced power consumption.

The operation of device 10 can be explained by using an arbitrary reference to certain directions. The elements of the x-axis sensor of FIG. 1 are rotated counterclockwise from crystal axis 44. For example, element 20 is rotated about 50 degrees to cause its total anisotropy field to be displaced from the crystal anisotropy field 44 by about 45 degrees and to be in a first direction. The easy axis of the shape anisotropy field of element 20 is along the length of element 20. The elements of the y-axis sensor of FIG. 1 are rotated clockwise from crystal easy axis 44. For example element 34 is rotated about 50 degrees to cause its total anisotropy field to be displaced from the crystal anisotropy field 44 by about 45 degrees and to be in a second direction. The easy axis of the shape anisotropy field of element 34 is along the length of element 34. The second direction corresponds with the total anisotropy field of element 34 and is perpendicular to the total anisotropy field of element 20. Passing a current through coil 14 will result in a magnetic field, which, for example, at element 20 of the x-axis sensor will be perpendicular to coil 14 at the location of element 20, and in the first direction. Similarly, the same current through coil 14 will result in a magnetic field, which, for example, at element 34 of the y-axis sensor will be perpendicular to coil 14 at the location of element 34, and in the second direction.

The present invention has been described with reference to the specific embodiment of FIG. 1; however, other embodiments will be apparent. For example, with regard to the magnetoresistive material, the thin films used for the magnetoresistive sensor are deposited on substrates. Different substrate underlayer and different deposition conditions result in either textured polycrystal thin film or random distributed polycrystal thin films.

Permalloy films grown on silicon substrates in the presence of a magnetic field usually have magnetic preferred orientation. That is, it is a textured film and has an effective crystal anisotropy field. However, with carefully chosen substrates, the film deposited in the absence of a magnetic field could be random distributed, and without any magnetic preferred orientation, which means no effective crystal anisotropy field existing in the film.

Alternative embodiments of device 10 may use a random distributed film with no effective crystal anisotropy field. In this alternative embodiment, the total anisotropy field would include only the shape anisotropy field component and would be along the length of a magnetoresistive element. In this embodiment, the angle of the magnetoresistive elements with the set reset strap would be 90°, rather than the 95° angle shown in FIG. 1.

Spatial relationships other than those shown in FIG. 1 for bridge elements 34, 36, 38 and 40, and the set-reset strap 14 can be used. For example, the four elements of one bridge could be arranged so that the magnetization was set in the same direction in four elements. A set-reset strap or coil could have a meander form or a serpentine form, or other forms, rather than the spiral form of FIG. 1. Two coils could be used rather than the single coil of FIG. 1.

A single magnetoresistive strip could form a leg of a Wheatstone bridge, rather than the multiple strips of magnetoresistive material shown in FIG. 1.

Magnetoresistive elements could be devised with different barberpole orientations for different portions of a single leg of a Wheatstone bridge, with the set-reset current flowing in opposite directions at the different portions of the single leg.

In addition, spatial relationships of elements, arrangements of barberpoles, forms of a set-reset strap and other variations not specifically described herein can be devised.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

The invention claimed is:

1. An integrated device for measuring magnetic fields comprising:
    a first sensor unit comprising a first full bridge circuit and a second sensor unit comprising a second full bridge circuit;
    said first sensor unit and said second sensor unit comprising magneto resistive material formed directly on a single substrate and having the same crystal anisotropy field;
    said first sensor unit comprising at least one sensing element having an elongated shape and having a total anisotropy field in a first direction;
    said first sensor unit having an output related to magnetic field components perpendicular to said first direction;
    said second sensor unit comprising at least one sensing element having an elongated shape and having a total anisotropy field in a second direction with said second direction being substantially perpendicular to said first direction;
    said second sensor unit having an output related to magnetic field components in a direction substantially perpendicular to said second direction; and
    said integrated device being independent of a biasing magnet.

2. The integrated device of claim 1 wherein said single substrate is a semiconductor substrate.

3. The integrated device of claim 1 further comprising means for setting a direction of magnetization in at least a portion of said first sensor unit and for setting a direction of magnetization in at least a portion of said second sensor unit.

4. The integrated device of claim 1 wherein said direction of magnetization set in said portion of said first sensor unit and said direction of magnetization set in said portion of said second sensor unit are substantially perpendicular.

5. The integrated device of claim 4 wherein said first sensor unit and said second sensor unit are formed in a common plane and said means for setting a direction of magnetization is a conductor located in a plane spaced from said common plane.

6. The integrated device of claim 5 further comprising biasing means selected to change an angle between a current in said bridge elements and a direction of magnetization in said bridge elements.

7. The integrated device of claim 6 wherein said biasing means comprises angled strips of a conductive material extending across at least a portion of said bridge elements.

8. The integrated device of claim 7 wherein said bridge elements are non perpendicular to said conductor and said angled strips form an angle about 45 degrees with said coil.

9. The integrated device of claim 7 wherein said bridge elements are perpendicular to said conductor.

* * * * *